United States Patent [19]
Yoneda

[11] Patent Number: 5,285,092
[45] Date of Patent: Feb. 8, 1994

[54] SEMICONDUCTOR MEMORY DEVICE HAVING A STACKED TYPE CAPACITOR AND MANUFACTURING METHOD THEREFOR

[75] Inventor: Masahiro Yoneda, Hyogo, Japan

[73] Assignee: Mitsubishi Denki Kabushiki Kaisha, Tokyo, Japan

[21] Appl. No.: 918,098

[22] Filed: Jul. 24, 1992

Related U.S. Application Data

[63] Continuation of Ser. No. 446,744, Dec. 6, 1989, Pat. No. 5,177,574.

[30] Foreign Application Priority Data

Dec. 8, 1988 [JP] Japan .................. 63-312420

[51] Int. Cl.$^5$ ............................................. H01L 29/68
[52] U.S. Cl. ........................... 257/306; 257/296; 257/309
[58] Field of Search ............... 357/23.6; 257/307, 308, 257/306, 296, 309

[56] References Cited

U.S. PATENT DOCUMENTS

| | | | |
|---|---|---|---|
| 4,700,457 | 10/1987 | Matsukawa | 437/52 |
| 4,742,018 | 5/1988 | Kimura et al. | 357/23.6 |
| 4,754,313 | 6/1988 | Takemae et al. | 257/306 |
| 4,888,628 | 12/1989 | Bergemont | 357/23.6 |
| 4,899,203 | 2/1990 | Ino | 357/23.6 |
| 4,953,126 | 8/1990 | Ema | 357/23.6 |
| 4,974,040 | 11/1990 | Taguchi et al. | 357/23.6 |
| 4,985,718 | 1/1991 | Ishijima | 257/306 |
| 5,006,481 | 4/1991 | Chan et al. | 357/23.6 |
| 5,177,574 | 1/1993 | Yoneda | 257/306 |

FOREIGN PATENT DOCUMENTS

| | | |
|---|---|---|
| 0295709 | 12/1988 | European Pat. Off. . |
| 1-154552 | 6/1989 | Japan .................. 357/23.6 |
| 2-94554 | 4/1990 | Japan .................. 257/306 |

OTHER PUBLICATIONS

T. Kisu, "A Novel Storage Capacitance Enlargement Structure Using a Double-Stacked Storage Node in STC DRAM Cell," 20th International Conf. on Solid State Devices and Materials, 1988, pp. 581-584.

T. Ema et al., "3-Dimensional Stacked Capacitor Cell for 16M and 64M DRAMS," IEDM, 1988, pp. 592-595.

R. M. Geffkan et al., "Process for High-Capacitance Single-Device Memory Cell", IBM Technical Disclosure Bulletin, vol. 21, No. 6, Nov. 1978, pp. 2257-2259.

*Primary Examiner*—Jerome Jackson
*Assistant Examiner*—Courtney A. Bowers
*Attorney, Agent, or Firm*—Lowe, Price, LeBlanc & Becker

[57] ABSTRACT

A capacitor of a semiconductor memory device includes a planar type capacitor portion formed on a surface of an impurity region and a stacked type capacitor portion extending above the gate electrode. The stacked capacitor portion has a three-layer structure of polycrystalline silicon in which upper, lower and side surfaces of a lower electrode are surrounded by a dielectric layer and the upper electrode. A portion of a dielectric layer in the stacked capacitor portion is coupled to another dielectric layer formed on the surface of one impurity region. The capacitor has a planar type capacitor provided in the planar area of occupation of the stacked capacitor portion, whereby the capacitance of the capacitor can be increased without increasing the planar area of occupation.

7 Claims, 11 Drawing Sheets

SEMICONDUCTOR MEMORY DEVICE HAVING A STACKED TYPE CAPACITOR AND MANUFACTURING METHOD THEREFOR

This application is a continuation of application Ser. No. 07/446,744 filed Dec. 6, 1989, U.S. Pat. No. 5,177,574.

BACKGROUND OF THE INVENTION

1. Field of the Invention

The present invention relates to semiconductor memory devices and, more specifically to a structure of a semiconductor memory device having a so-called a stacked capacitor cell as a charge storing portion.

2. Description of the Background Art

Recently, semiconductor memory devices are in great demand, as information devices such as computers have come to be widely used. Especially, semiconductor memory devices having larger memory capacitances and higher reliability have come to be increasingly desired. Under such circumstances, various developments have been made for increasing degree of integration and improving reliability of the semiconductor memory devices. DRAM (Dynamic Random Access Memory) is one of the semiconductor memory devices, which is capable of random input/output of memory information. Generally, a DRAM comprises a memory cell array which is a memory region for storing a number of memory information and peripheral circuits necessary for external input/output.

FIG. 4 is a block diagram showing a structure of a common DRAM. Referring to FIG. 4, a DRAM 50 comprises a memory cell array 51 for storing data signals of memory information, a row and column address buffer 52 for externally receiving address signals $A_0$ to $A_9$ for selecting a memory cell constituting a unit memory circuit, row decoder 53 and column decoder 54 for designating the memory cell by decoding the address signal, a sense refresh amplifier 55 for amplifying and reading a signal stored in the designated memory cell, data in buffer 56 and data out buffer 57 for inputting/outputting data, and a clock generator 58 for generating clock signal serving as control signals to respective portions.

The memory cell array 51 occupying a large area on a semiconductor chip is formed of an array of a plurality of memory cells each storing unit memory information. FIG. 5 is an equivalent circuit diagram of 4 bits of memory cells constituting the memory cell array 51. The memory cell array 51 comprises a plurality of word lines 1a, 1b, 1c and 1d extending in parallel with each other in row direction and a plurality of bit line pairs 2a and 2b extending in parallel to each other in column direction. Memory cells are formed in the proximity of intersections between the word lines 1a to 1d and the bit lines 2a and 2b. The memory cell 3 is formed of 1 MOS (Metal Oxide Semiconductor) transistor 4 and 1 capacitor 5. The arrangement such as shown in FIG. 5 in which a pair of bit lines 2a and 2b are arranged in parallel to each other on a side of a sense refresh amplifier 55 is called a folded bit line type structure.

A planar layout of the DRAM in the range shown in the equivalent circuit diagram of FIG. 5 is shown in FIG. 6. Four memory cells are shown in FIG. 6. The respective memory cells are formed of a set of MOS transistors Q1, Q2, Q3 and Q4 and capacitors Cs1, Cs2, Cs3 and Cs4 formed in operational regions A1, A2, A3 and A4. Gate electrodes constituting the transistors Q1 to Q4 are formed of portions of word lines 1a to 1d corresponding to the respective memory cells. Bit lines 2a and 2b are formed above the word lines 1a to 1d insulated from and intersecting with the word lines 1a to 1d. The bit lines 2a and 2b are connected to the memory cells through contact holes C1, C2 and C3.

A cross sectional structure of the memory cells taken along the line VII—VII of FIG. 6 is shown in FIG. 7. 2 bits of memory cells 3, 3 are shown in FIG. 7. The memory cell 3 is formed 1 MOS transistor 4 and a capacitor 5. The MOS transistor 4 comprises a pair of source-drain regions 6, 6 formed spaced apart from each other on a surface of silicon substrate 40 and a gate electrode 8 (1b, 1c) formed on the surface of the silicon substrate 40 with a gate oxide film 7 posed therebetween. The capacitor 5 comprises a lower electrode (storage node) 9 connected to one of the source-drain regions 6,6 of the MOS transistor 4, a dielectric layer 10 formed on the upper surface of the lower electrode 9 and an upper electrode (cell plate) 11 covering the upper surface of the dielectric layer 10. The lower and upper electrodes 9 and 11 are formed of, for example, polycrystalline silicon. Such a capacitor having a stacked structure is called a stacked capacitor. The stacked capacitor 5 has one portion extending to an upper portion of the gate electrode 8 with an insulating film 12 posed therebetween, and the other portion extending to an upper portion of a field oxide film 13. The surface of the silicon substrate 40 on which the capacitor 5 and so on are formed is covered with a thick interlayer insulating film 14. The bit line 2b passing through the upper portion of the interlayer insulating film 14 is connected to the other one of the source-drain regions 6 of the MOS transistor 4 through a contact hole 15.

A method of manufacturing a memory cell of a conventional DRAM will be described in the following with reference to FIGS. 8A to 8E.

First, as shown in FIG. 8A, a field oxide film 13 for isolating elements formed of a silicon oxide film, for example, is formed on the silicon substrate 40. Consequently, an active region 16 for forming elements is provided on the surface of the silicon substrate 40.

Thereafter, referring to FIG. 8B, a gate electrode 8 is formed on the active region with a gate oxide film 7 posed therebetween, and at the same time, a word line 1d is formed on a prescribed position of the field oxide film 13. A pair of impurity regions having lower concentration are formed in the silicon substrate 40 using the gate electrode 8 as a mask. Then, the gate electrode 8 and the surroundings of the word line 1d are covered with an insulating film 12. Then, impurities are introduced into the silicon substrate 40 by using the gate electrode 8 covered with the insulating film 12 as a mask, to form the source-drain regions 6, 6 having higher impurity concentration.

Thereafter, referring to FIG. 8C, a polycrystalline silicon layer is deposited on the entire surface of the silicon substrate 40. Thereafter, the polycrystalline silicon layer is patterned to a prescribed shape. BY doing so, the lower electrode 9 extending from the upper portion of the gate electrode 8 to the upper portion of the filed oxide film 13 and electrically connected to one of the source-drain regions 6 is formed.

Thereafter, referring to FIG. 8D, the dielectric layer 10 of a silicon nitride film and an upper electrode 11 formed of polycrystalline silicon are formed on the surface of the lower electrode 9.

Finally, referring to FIG. 8E, a thick interlayer insulating film 14 is formed. A contact hole 15 is formed at a prescribed the position and thereafter the bit line 2b is formed. Consequently, the bit line 2b is connected to the other one of the source-drain regions 6 of the MOS transistor 4. Through the above described steps, the memory cell 3 of a DRAM is manufactured.

Generally, the charge storing capacitance of the capacitor 3 is in proportion to the opposing areas of the lower electrode 9 and the upper electrode 11 facing to each other with the dielectric layer 10 posed therebetween. Therefore, the opposing areas should be increased in order to increase the capacitance of the capacitor 3. However, as described above, the device structure of DRAM has been continuously reduced in size. Planar area of occupation in the memory cell structure has been reduced in order to improve the degree of integration. For this purpose, the planar area of occupation of the capacitor has been limited and reduced. The reduction of the opposing areas between the electrodes of the capacitor 5 and accordingly, the reduction of the capacitance of the capacitor cause the following drawbacks.

(a) When the capacitance of the capacitor 5 is reduced, the amount of signal reading from the capacitor 5 is also reduced. Consequently, the sensitivity to the memory signals is reduced, degrading the reliability of the DRAM.

(b) Malfunctions tend to occur by the generation of soft errors induced by $\alpha$ rays.

Therefore, the reduction of the capacitor capacitance leads to essential degradation of the function of the DRAM, causing serious problems.

Structures shown in FIGS. 9 and 10 have been proposed to increase the capacitance of the capacitor.

The capacitor shown in FIG. 9 is described in detail in "A Novel Storage Capacitance Enlargement Structure Using a Double-Stacked Storage Node in STC DRAM Cell" by T. Kisu, et al. 20th International Conference on Solid State Devices and Materials, 1988, pp. 581-584. The capacitor 5 comprises a lower electrode 9 having two polysilicon layers partially stacked spaced apart from each other. The dielectric layer 10 and the upper electrode 11 are formed to cover the concave and convex surfaces of the two-layered lower electrode 9.

The capacitor shown in FIG. 10 is described in detail in "3-DIMENSIONAL STACKED CAPACITOR CELL FOR 16M and 64M DRAMS" by T. Ema, et al, IEDM 88, pp. 592-595. The capacitor 5 comprises a lower electrode 9 formed to have a plurality of fins. The dielectric layer 10 and the upper electrode 11 are formed along the fin shaped portion of the lower electrode 9.

The above described two capacitors are adapted to increase capacitance of the capacitors by forming the surface of the lower electrode 9 with fins and accordingly, by increasing the opposing areas between the lower and upper electrodes 9 and 11.

However, the idea of effectively using the surface area of the impurity region as a portion of the capacitor is not disclosed in either of the above described capacitors.

SUMMARY OF THE INVENTION

An object of the present invention is to increase capacitance of the capacitor employed in a semiconductor memory device.

Another object of the present invention is to increase the opposing areas between both electrodes of a capacitor employed in a semiconductor memory device.

A further object of the present invention is to form a capacitor employed in a semiconductor memory device by a coupled structure of a stacked type capacitor and a planar type capacitor.

A still further object of the present invention is to provide a method of manufacturing a semiconductor memory device having a capacitor whose capacitance is increased.

In accordance with one aspect of the present invention, a memory capacitor of a semiconductor memory devices comprises a first electrode layer, a dielectric layer and a second electrode layer.

The first electrode layer has one portion connected to an impurity region formed on a main surface of a semiconductor substrate. The dielectric layer is formed continuously over the surface of the first electrode layer and the surface of the impurity region. The second electrode layer is formed to cover the surface of the dielectric layer. Therefore, the capacitor comprises a stacked type capacitor portion having the first electrode layer, the dielectric layer and the second electrode layer, and a planar type capacitor portion having an impurity region, the dielectric layer and second electrode layer. The stacked type capacitor portion increases the capacitance of the capacitor, as the upper surface, the side surface and the lower surface of the first electrode layer are surrounded by the dielectric layer and the second electrode layer to increase the opposing area. The addition of the planar type capacitor portion further increases the capacitance of the capacitor.

In accordance with another aspect of the present invention, the capacitor of the semiconductor memory device is manufactured by forming an impurity region on a main surface of the semiconductor substrate, and then a portion of the dielectric layer is formed selectively on the surface of the impurity region. Thereafter, a second conductive layer, the first dielectric layer, a third conductive layer which will be the first electrode layer, a second dielectric layer and a fourth conductive layer are formed on a first conductive layer such as the gate electrode and on the dielectric layer. The respective layers are formed by successively repeating the steps of deposition and of patterning to provide prescribed shapes. The first dielectric layer, the second dielectric layer and the dielectric layer formed on the surface of the impurity layer are continuously connected. The second conductive layer and the fourth conductive layer are also continuously connected to form the second electrode layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
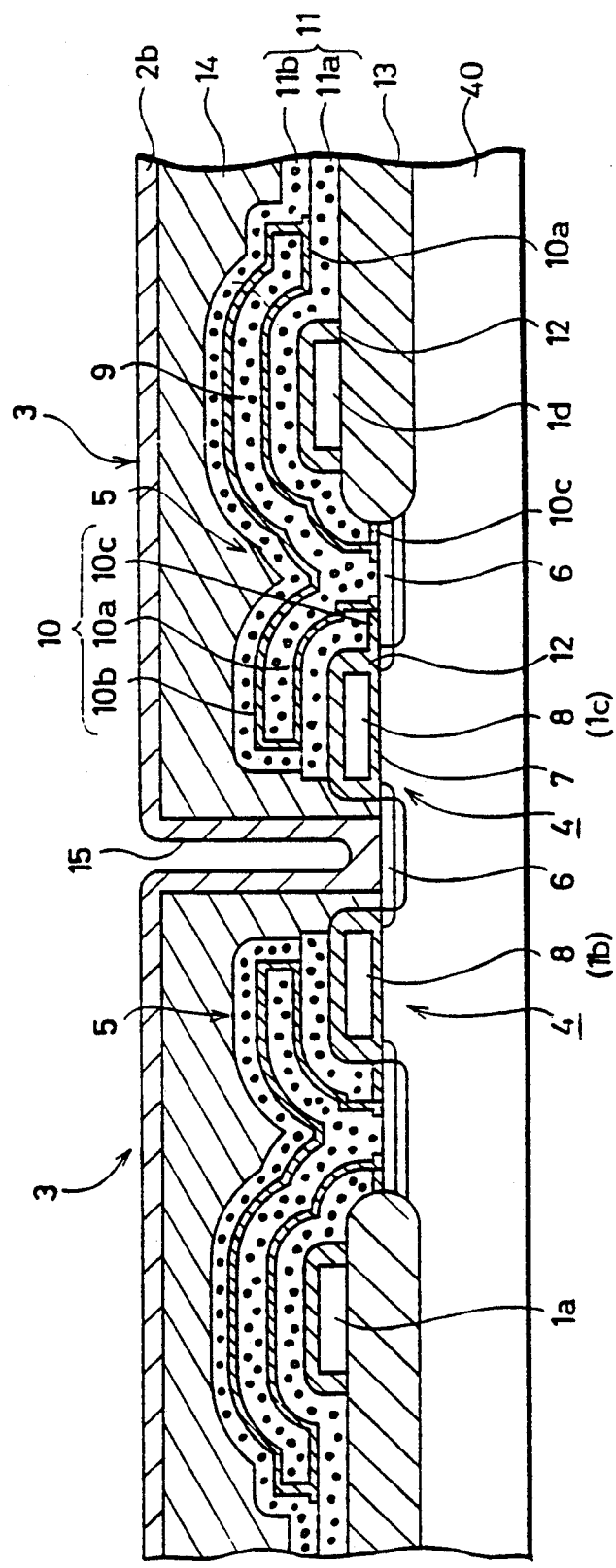
FIG. 1 is a cross sectional view of a memory cell of a DRAM in accordance with a first embodiment of the present invention.

FIG. 1 shows 2 bits of memory cells. Referring to the figure, a memory cell 3 comprises a MOS transistor 4 and a capacitor 5. The MOS transistor 4 comprises a pair of source-drain regions 6, 6 formed spaced apart from each other on a surface of a p type silicon substrate 40 and a gate electrode 8 (word line 1b, 1c) formed on the surface of the silicon substrate 40 between the source-drain regions 6,6 with a gate oxide film 7 posed therebetween.

The capacitor 5 comprises a lower electrode 9 and an upper electrode 11 having two layers stacked to sandwich from both sides the lower electrode 9. A dielectric layer 10 is formed between the opposing surfaces of the lower electrode 9 and the upper electrode 11. A portion of the lower electrode 9 is connected to one of the source-drain regions 6 of the MOS transistor 4. The dielectric layer 10 comprises a first portion 10c covering the surface of the source-drain region 6, a second portion 10b covering the lower surface of the lower electrode 9 and a third portion 10a covering the upper and side surfaces of the lower electrode 9. The lower layer 11a and the upper layer 11b of the upper electrode 11 are formed to completely cover the surface region of the dielectric layer 10. The upper electrode 11 is connected to a prescribed potential point.

Figure 7:
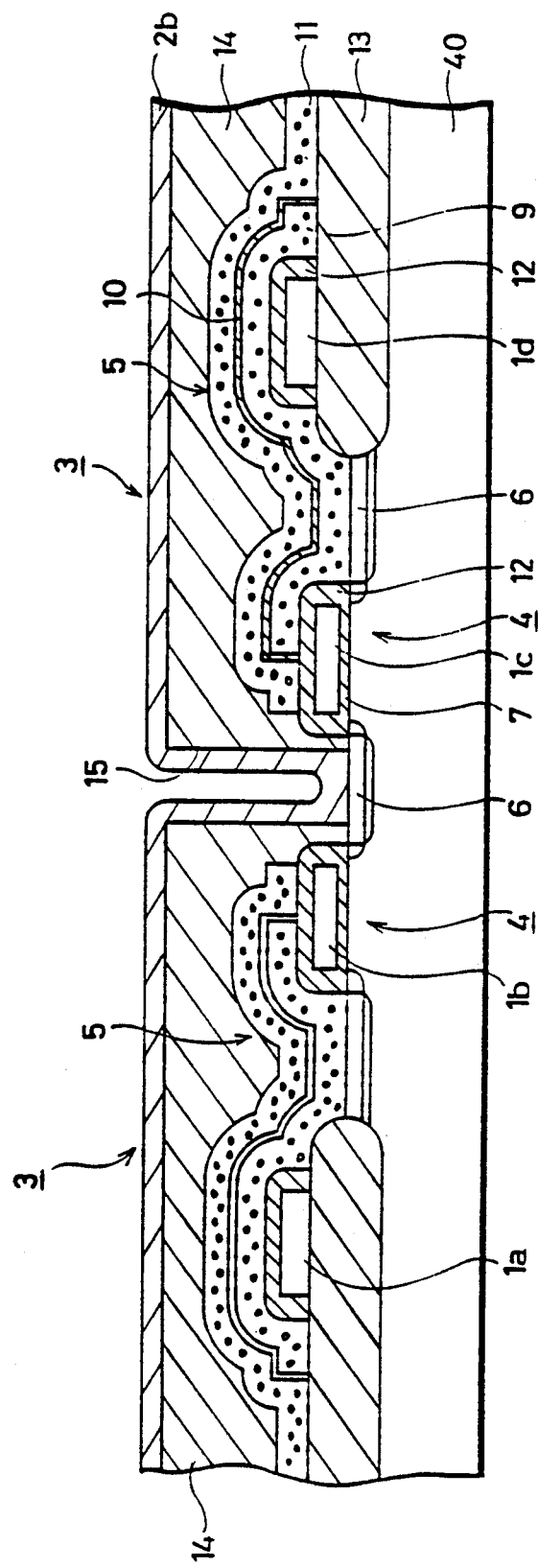
FIG. 7 is a cross sectional view taken along the line VII—VII of FIG. 6.
Figure 8A:
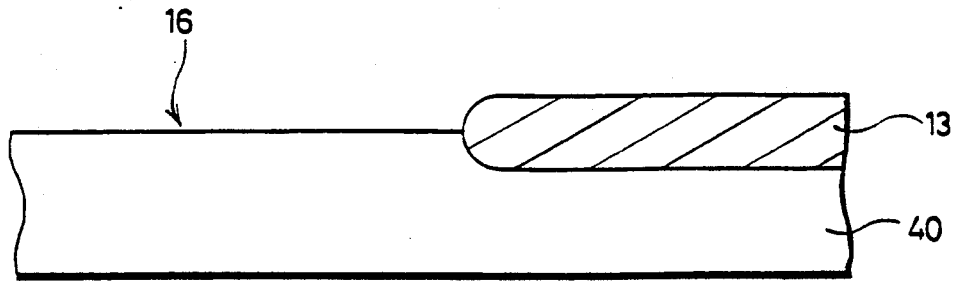
FIGS. 8A to 8E are cross sectional views showing, in this order, the steps of manufacturing the memory cell of the DRAM shown in FIG. 7.
Figure 8B:
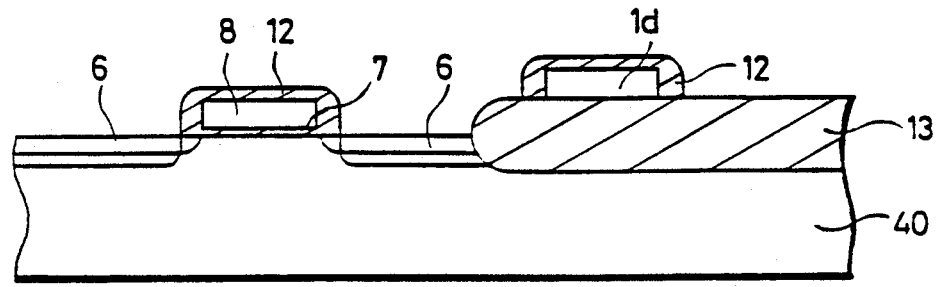
Figure 8C:
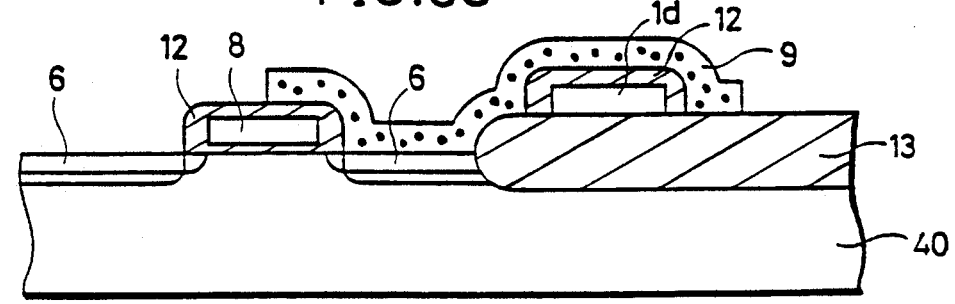
Figure 8D:
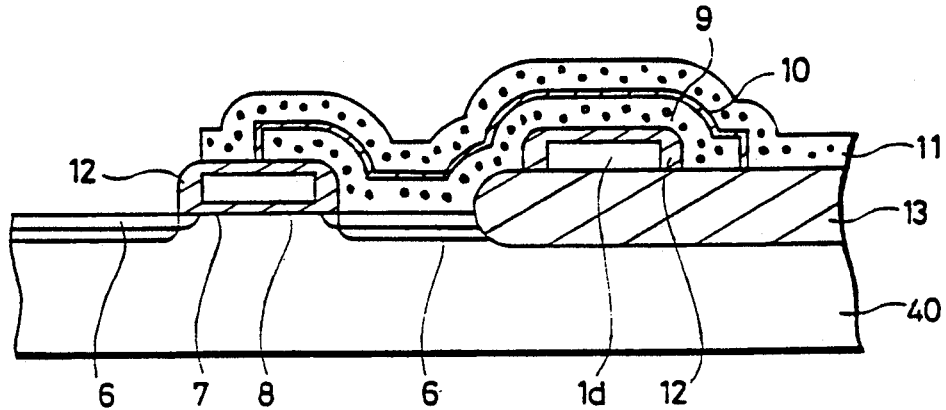
Figure 8E:
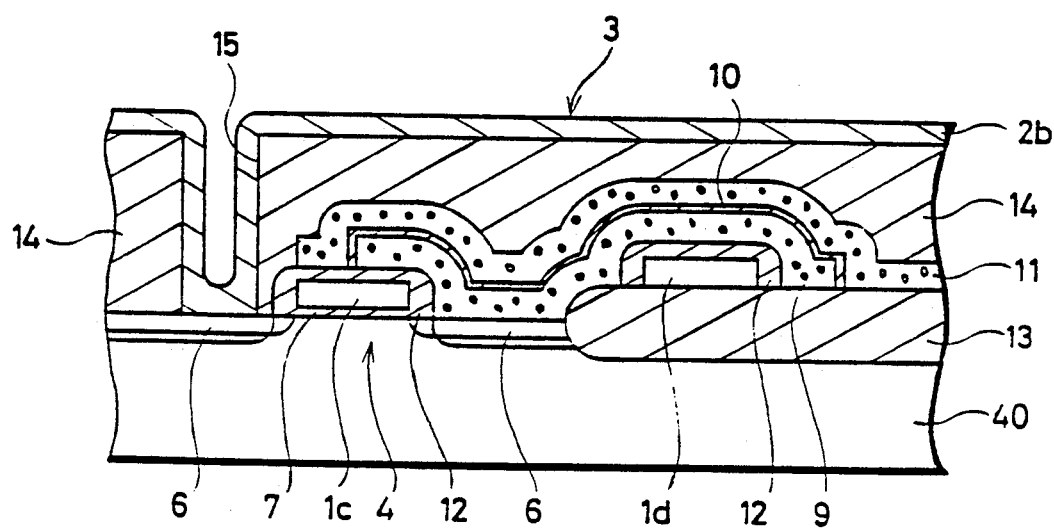
Figure 9:
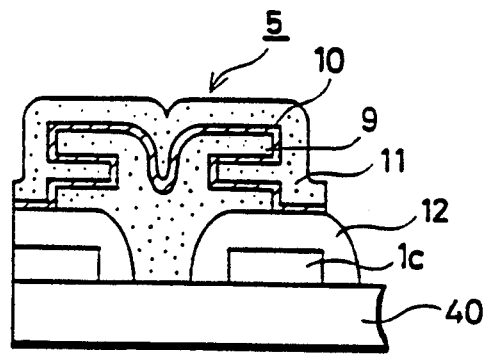
FIG. 9 is a cross sectional structure of a DRAM having a stacked capacitor of another conventional example.
Figure 10:
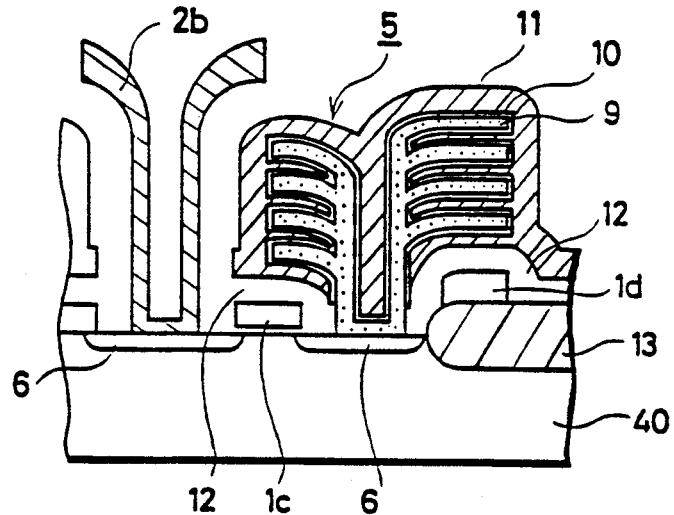
FIG. 10 is a cross sectional structure of DRAM having a stacked capacitor in accordance with a further conventional example.

In this manner, the capacitor 5 of the present embodiment has a three-layer structure in which the lower electrode 9, the upper layer 11b and the lower layer 11a of the upper electrode 11 are stacked with the lower electrode 9 being the intermediate layer. In the capacitor 5 having such a three-layer structure, the areas where the upper surface, the lower surface and the side surfaces of the lower electrode 9 are facing the upper electrode 11 constitute a so-called stacked type capacitor. In addition, the stacked portion of the source-drain region 6, the first portion 10c of the dielectric layer and the lower layer 11a of the upper electrode 11 constitute a so-called planar type capacitor. Therefore, compared with a conventional two-layered stacked capacitor, portions for storing charges are increased in such structure. In addition, the planar area of occupation on the surface of the silicon substrate 40 is not increased compared with the conventional device. For example, the thicknesses of respective layers in the capacitor 5 are as follows. The dielectric layer 10 is about 5 to 15 nm in thickness, the lower electrode 9 is about 100 to 300 nm and the upper and lower layers 11b and 11b of the upper electrode 11 are about 100 to 300 nm, respectively. The planar projection area of the lower electrode 9 is about 5 $\mu m^2$, and the actual planar area is about 8 $\mu m^2$. Under this condition, the capacitance of the capacitor of this example can be increased to about 1.95 times as large as the capacitance of the conventional capacitor shown in FIG. 7. In the capacitor of this embodiment, a parasitic capacitor is formed by the structure of the gate electrode 8, the insulating filml 2 and the lower layer 11a of the upper electrode 11. However, one of the electrodes of the parasitic capacitor is an upper electrode connected to a fixed potential. Therefore, the parasitic capacitor does not cause a delay in the responsiveness of the MOS transistor 4.

The method of manufacturing the DRAM memory cell of the above embodiment will be described in the following with reference to FIGS. 2A to 2I. FIGS. 2A to 2I are cross sectional views showing, in this order, the steps of manufacturing the memory cell.

Figure 2A:
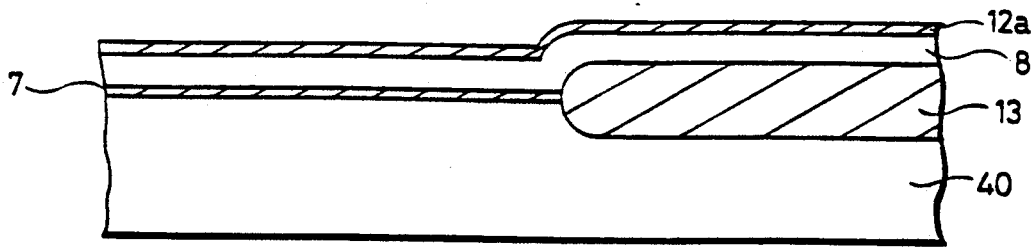
FIGS. 2A to 2I are cross sectional views showing, in this order, the steps of manufacturing the memory cell of FIG. 1.

First, referring to FIG. 2A, a field oxide film 13 for isolating elements is formed on a prescribed region on a surface of a p type silicon substrate 40. Then, an oxide film 7 which will be the gate oxide film is formed on the surface of the silicon substrate 40. A polysilicon layer 8 is formed by using CVD (Chemical Vapor Deposition) method on the surface of the gate oxide film 7. An oxide film 12a for insulation is further formed on the surface thereof.

Figure 2B:
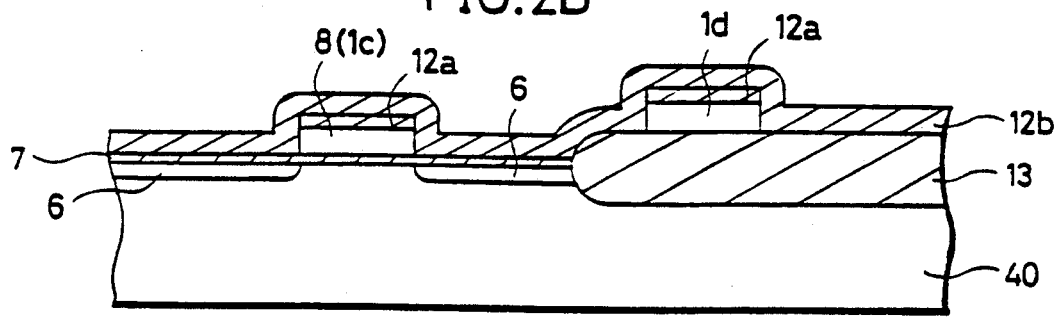

Thereafter, referring to FIG. 2B, the polysilicon layer 8 and the insulating film 12a are patterned to a prescribed shape to form a gate electrode 8 (word lines 1c and 1d). Then, n type impurities such as arsenic (As) or phosphorus (P) are introduced to the silicon substrate 40 by using the gate electrode 8 (1c) as a mask to form the source-drain regions 6 having lower concentration. Thereafter, an insulating film 12b is formed on the surface.

Figure 2C:
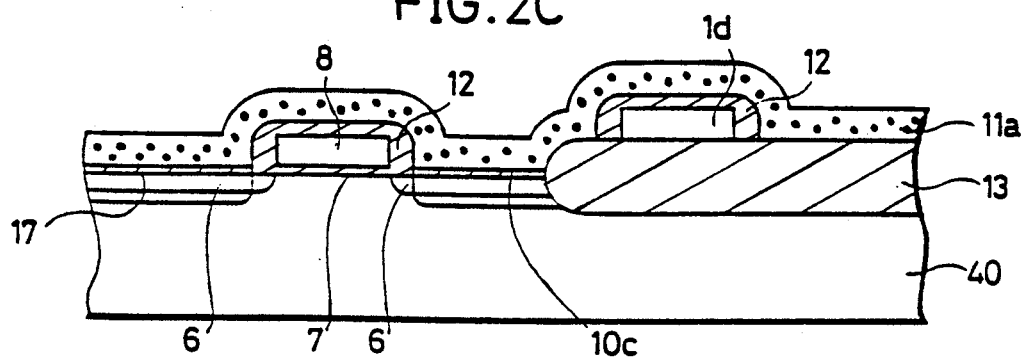

Then, referring to FIG. 2C, an insulating film 12 is formed in self alignment with the upper and side surfaces of the gate electrode 8 and the word line 1d by anisotropically etching the insulating film 12b. Impurity ions are implanted to the surface of the silicon substrate 40 by using the gate electrode 8 covered with the insulating film 12 as a mask, to form n type impurity regions having higher concentration. Consequently, a pair of source-drain regions 6, 6 of the MOS transistor 4 are formed. Thereafter, an insulating film 10c such as a silicon oxide film or a silicon nitride film is formed on the surface of the source-drain regions 6, 6. The insulating film 10c constitutes the first portion 10c of the dielectric layer of the capacitor 5. Thereafter, a polysilicon layer 11a is deposited on the entire surface by using the CVD method.

Figure 2D:
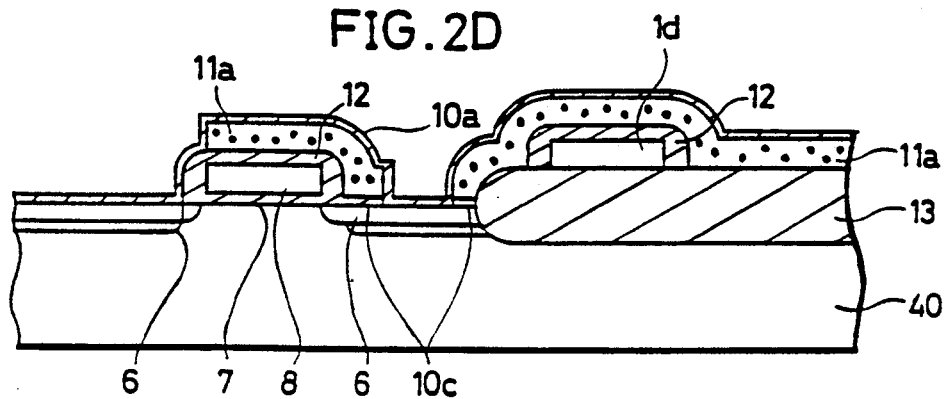

Then, as shown in FIG. 2D, the polysilicon layer 11a is patterned to a prescribed shape. Consequently, the lower layer 11a constituting the upper electrode 11 of the capacitor 5 is formed. The lower layer 11a has at least an opening portion reaching to the pair of source-drain region 6. Then, a silicon nitride 10a is formed on the surface of the lower layer 11a of the upper electrode and on the surface of the silicon substrate 40. The silicon nitride film 10 constitutes a portion of the dielectric layer 10 of the capacitor 5.

Figure 2E:
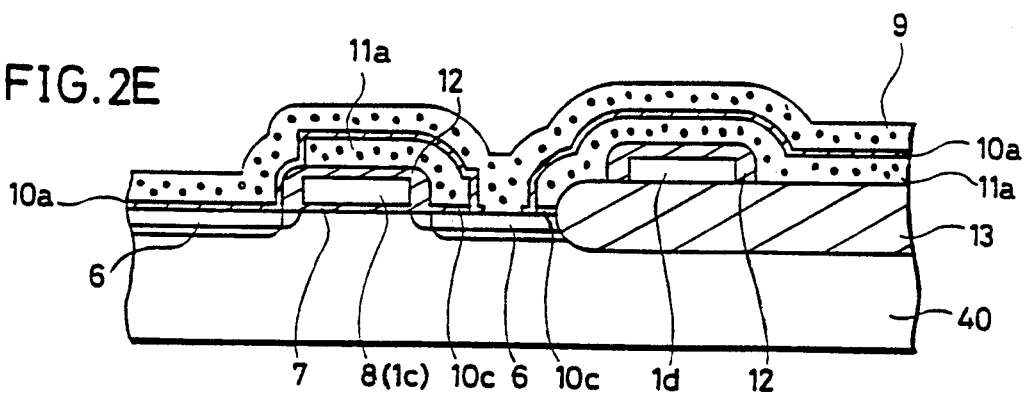

Thereafter, as shown in FIG. 2E, a portion of the silicon nitride film 10a formed on the opening portion on the surface of one of the source-drain regions 6 is removed to expose the surface of one of the source-drain regions 6. Thereafter, a polysilicon layer 9 is deposited on the entire surface by using the CVD method.

Figure 2F:
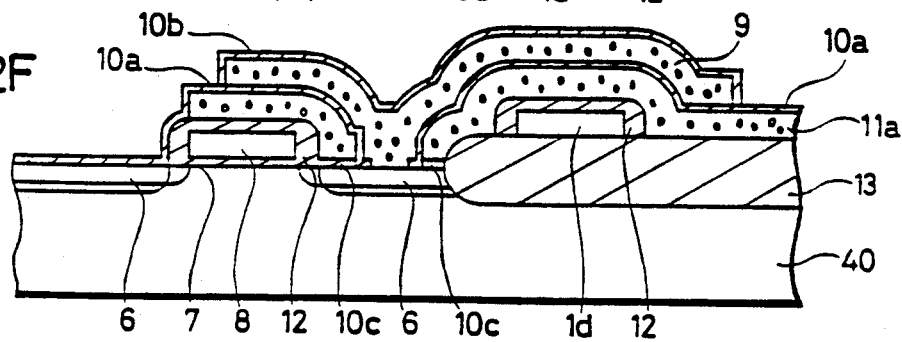

Then, referring to FIG. 2F, the polysilicon layer 9 is patterned to a prescribed shape. The patterned polysilicon layer 9 constitutes the lower electrode 9 of the capacitor 5. A portion thereof is connected to one of the source drain regions 6 of the MOS transistor 4 through an opening in the silicon nitride film 10a. Then, the silicon nitride film 10b is again formed on the surface of the lower electrode 9. By this step, the silicon nitride film 10b is connected to the lower layer silicon nitride film 10a to surround the surfaces of the lower electrode 9.

Figure 2G:
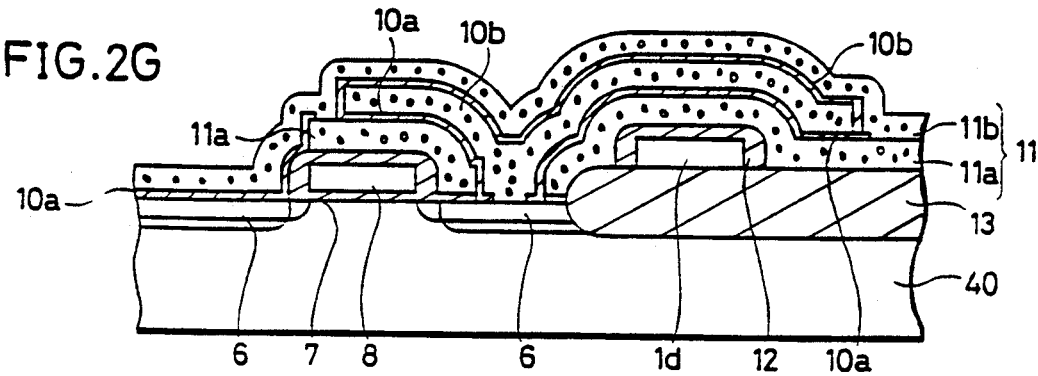

Then, as shown in FIG. 2G, a portion of the dielectric layer 10b formed on the lower layer 11a of the upper electrode 11 is removed to partially expose the surface of the lower layer 11a of the upper electrode 11. In this embodiment, the exposed portion of the lower layer 11a is a portion extending over the upper portion of the gate electrode 8 and over the upper portion of the field oxide film 13. Then, a polysilicon layer 11b is deposited on the entire surface by using the CVD method.

Figure 2H:
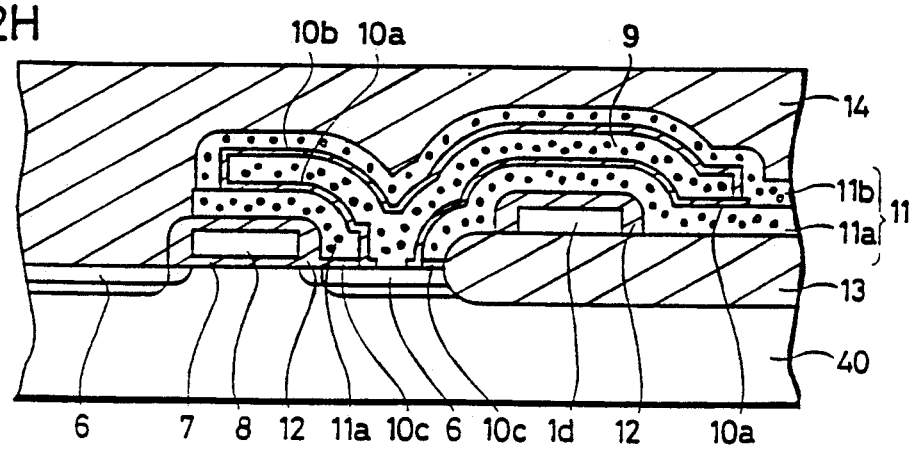

Thereafter, as shown in FIG. 2H, the polysilicon layer 11b is patterned to a prescribed shape to form the upper layer 11b of the upper electrode 11 of the capacitor 5. By this step, the lower layer 11a and the upper layer 11b of the upper electrode 11 are connected at the upper portion of the gate electrode 8 or at the upper portion of the field oxide film 13. Through the above described steps, the MOS transistor 4 and the capacitor 5 of the memory cell 3 are manufactured. Thereafter, the elements such as the capacitor 5 are covered with a thick interlayer insulating film 14.

Figure 2I:
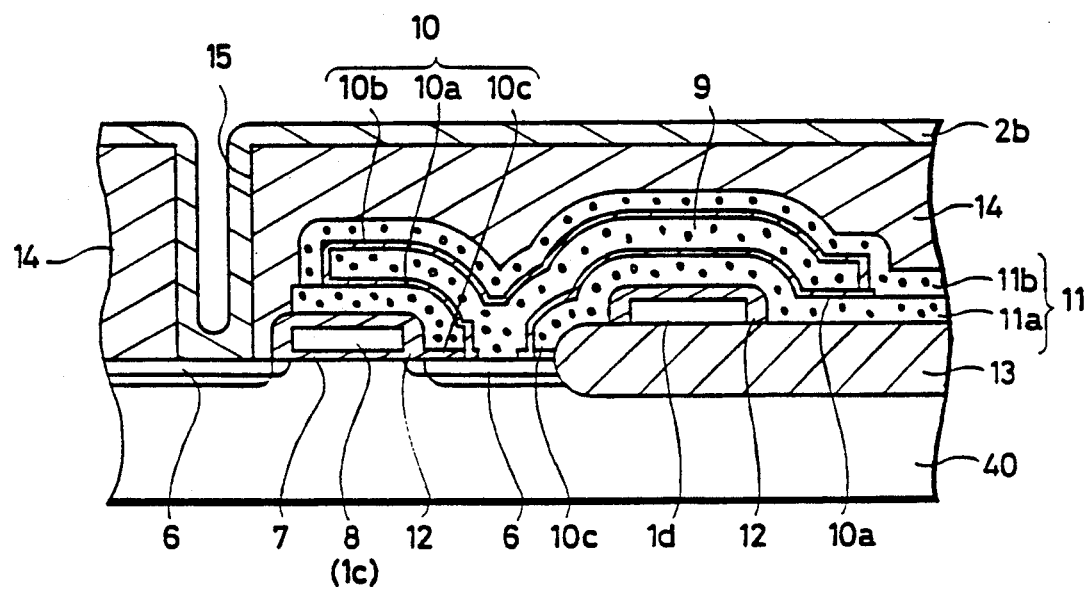

Referring to FIG. 2I, a contact hole 15 is formed which reaches the other one of the source-drain regions 6, in the interlayer insulating film 14. Then a bit line 2b formed of a polysilicon layer is formed on the interlayer insulating film 14 to be connected to the other one of the source-drain regions 6 of the MOS transistor 4.

Figure 3:
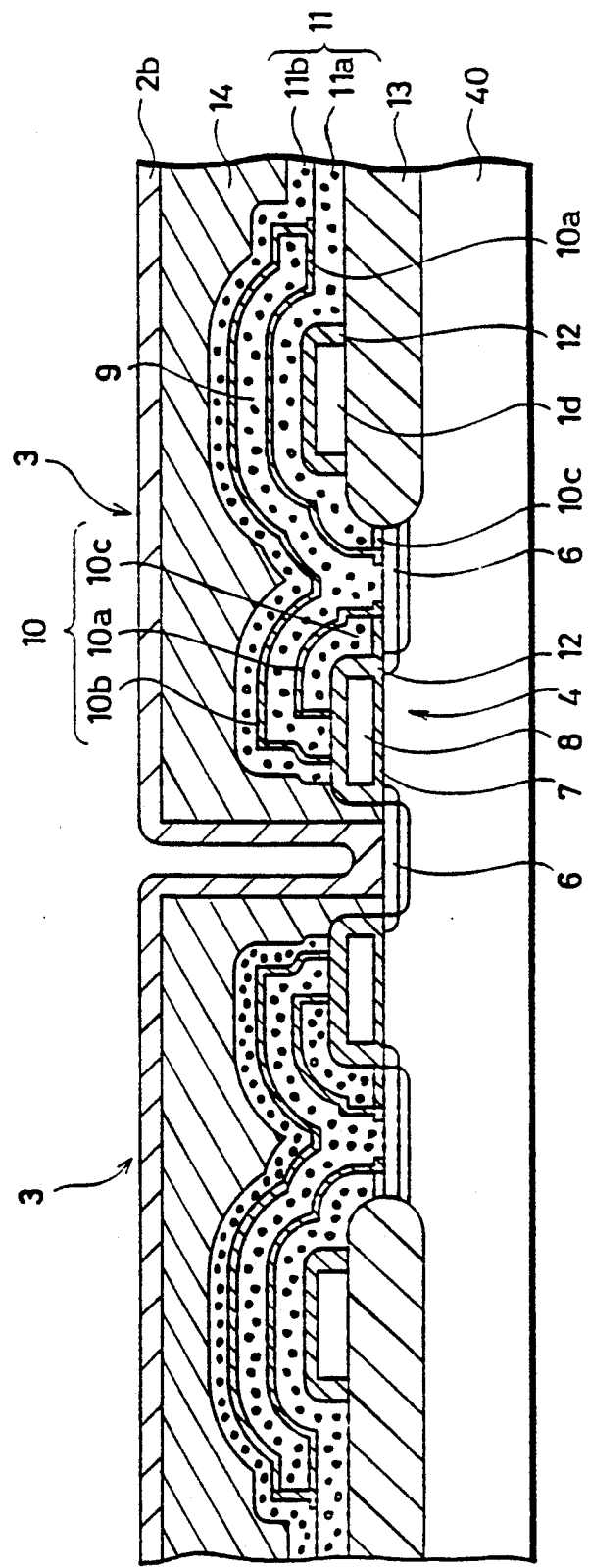
FIG. 3 is a cross sectional view of a memory cell of a DRAM in accordance with a second embodiment of the present invention.
Figure 4:
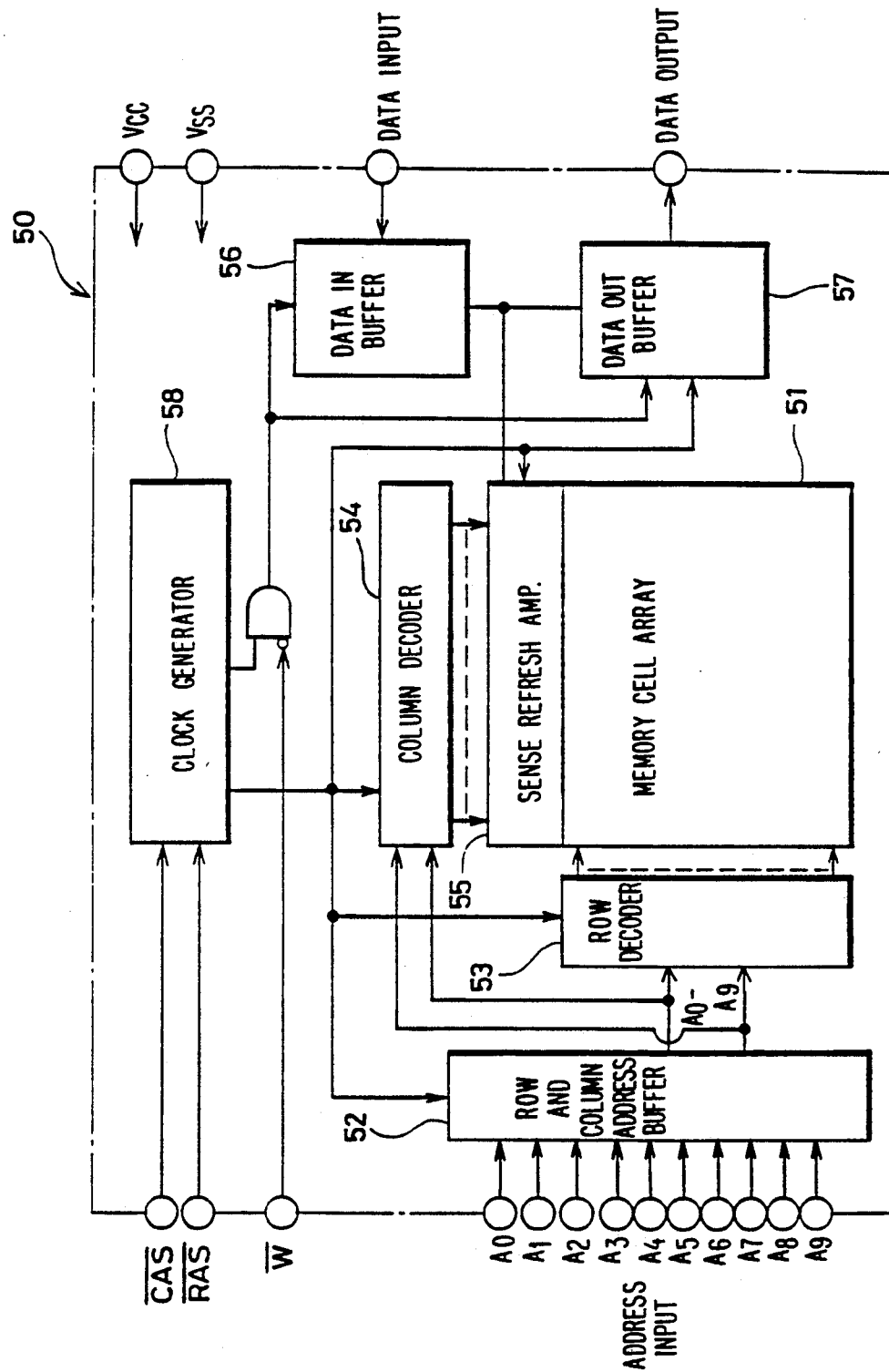
FIG. 4 is a block diagram showing a conventional DRAM device.
Figure 5:
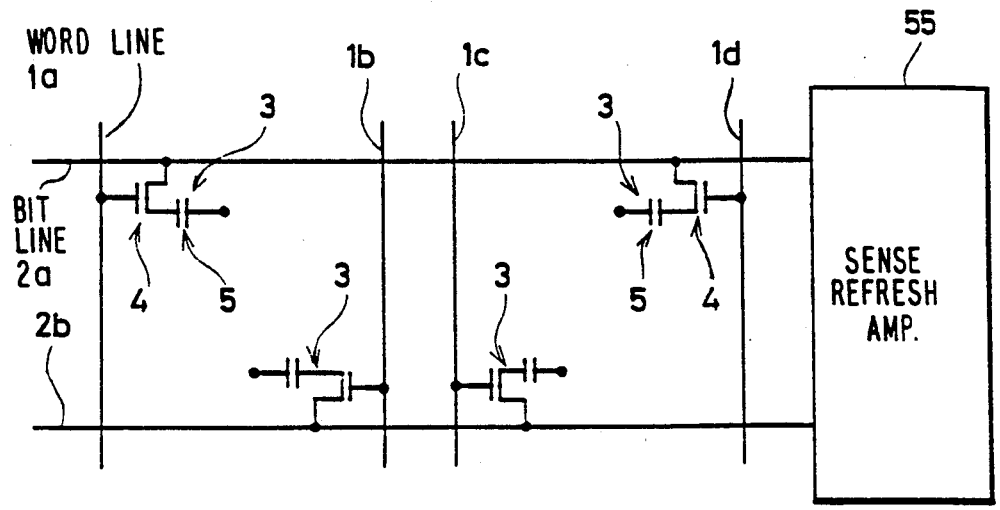
FIG. 5 is an equivalent circuit diagram showing 4 bits of memory cell structures of a memory cell array and a sense refresh amplifier of the DRAM shown in FIG. 4.
Figure 6:
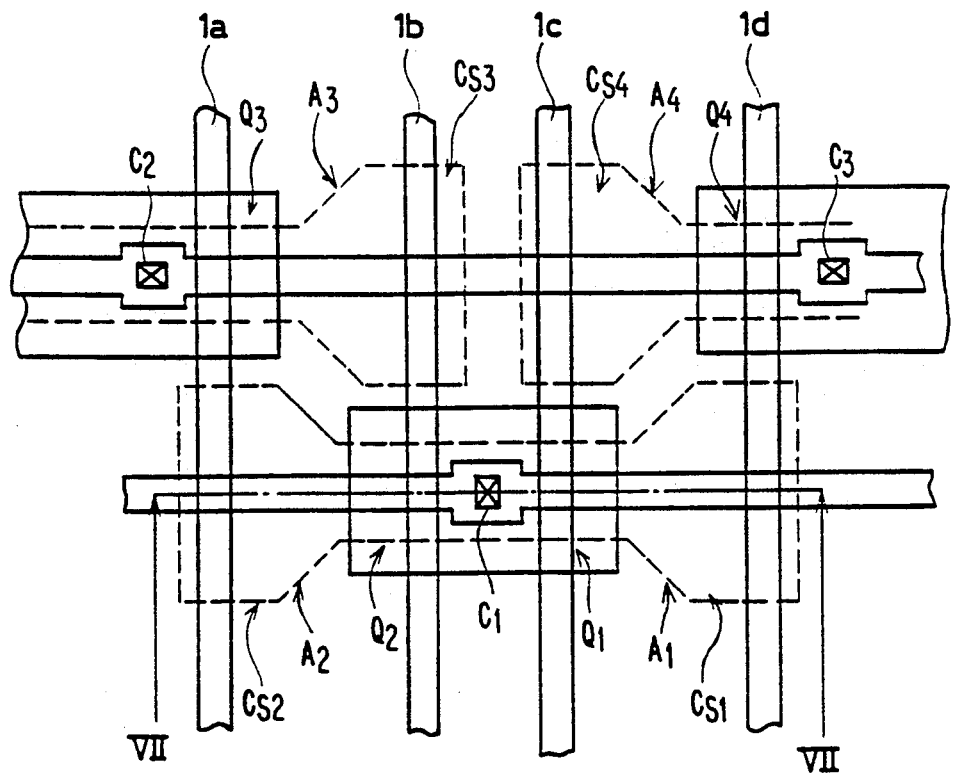
FIG. 6 is a plan view of the memory cell array shown in FIG. 5.

A second embodiment of the present invention will be described in the following with reference to FIG. 3. In this embodiment, a dielectric layer 10a is formed on a sidewall surface of the lower layer 11a of the upper electrode 11 of the capacitor 5 positioned above the gate electrode 8. In addition, a portion of the lower electrode 9, a dielectric layer 10b and a portion of the upper layer 11b of the upper electrode 11 are extended in parallel to the dielectric layer 10a. Consequently, the opposing areas of the lower electrode 9 and the upper electrode 11 are further increased than the embodiment shown in FIG. 1.

As described above, in the present invention, a three-layer structure in which the lower electrode 9 constituting the capacitor 5 is sandwiched by two layers, that is, the upper layer 11a and the lower layer 11b of the upper electrode 11, and dielectric layers 10 are posed between respective layers, so that a capacitor 5 is realized which has large opposing areas between the upper and lower electrodes 11 and 9 and accordingly a large charge storage capacitance. Compared with a conventional stacked capacitor, the capacitor capacitance per a unit planar area of occupation can be increased. In addition, the dielectric layer 10c and the upper electrode 11a are formed also on the surface of the source-drain region 6, additionally providing a planar type capacitor. This further increases the capacitor capacitance.

Although the dielectric layer 10 is formed of a silicon nitride film in the foregoing, a silicon oxide film or a multilayer film including a silicon nitride film and a silicon oxide film may be used.

As described above, according to the present invention, a capacitor element of a semiconductor memory device is adapted to have a stacked structure in which a capacitor for storing charges are sandwiched fixed electrodes, so that the capacitance of the capacitor for the same planar area of occupation can be increased, compared with a conventional device.

In accordance with the manufacturing method of the present invention, a stacked type capacitor having a three-layer structure can be easily manufactured utilizing conventional process steps.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a semiconductor substrate of a first conductivity type having an insulating film for isolating elements formed on a prescribed region of a main surface of said semiconductor substrate;
   a pair of impurity regions of a second conductivity type formed spaced apart from each other by a prescribed distance on the main surface of said semiconductor substrate;
   a first conductive layer formed on the main surface of said semiconductor substrate positioned between said pair of impurity regions with a first insulating film positioned between said first conductive layer and said semiconductor substrate;
   a second conductive layer formed on and passing over the surface of said insulating film for isolating elements;
   second and third insulating films covering outer surfaces of said first and second conductive layers, respectively;
   a first electrode layer connected to one of said pair of impurity regions extending from a position above said second insulating film covering said first conductive layer to a position above said third insulating film covering said second conductive layer;
   a dielectric layer including a first portion covering a rear surface of the first electrode layer, a second portion covering upper and side surfaces of the first electrode layer, and a third portion covering a surface of an impurity region to which the first electrode layer is connected; and
   a second electrode layer covering the surfaces of the first, second and third portions of said dieletric layer forming a capacitor structure comprising said second electrode, said third portion and said impurity region, wherein said second electrode layer and said third dielectric layer portion are fully separated from said first electrode layer by said first dielectric layer portion formed in contact with the surface of the impurity region, and wherein said third portion of the dielectric layer is fully separated from said third insulating film and formed in contact with the surface of said impurity region.

2. A semiconductor memory device according to claim 1, wherein said first and third portions of said dielectric layer are formed of different materials.

3. A semiconductor memory device according to claim 1, wherein
said second electrode layer comprises at least a first portion positioned between said first conductive layer and said first electrode layer and a second portion position between said second conductive layer and said first electrode layer.

4. A semiconductor memory device according to claim 2, wherein
said third portion of said dielectric layer is formed of an oxide film.

5. A semiconductor memory device according to claim 1, wherein said third insulating film is fully separated from the surface of said impurity region by said insulating film for isolating elements.

6. A semiconductor memory device according to claim 1, wherein said second electrode layer fully separates said third insulating film from said first portion of the dielectric layer.

7. A semiconductor memory device according to claim 1, wherein said third insulating film is fully separated from said first electrode layer.

* * * * *